(12) United States Patent
Halamoda et al.

(10) Patent No.: US 8,191,452 B2
(45) Date of Patent: Jun. 5, 2012

(54) DEVICE FOR PUNCHING GREEN SHEETS

(75) Inventors: Hans Joachim Halamoda, Albstadt (DE); Siegfried Beerhalter, Schwäbisch Gmünd (DE)

(73) Assignee: Groz-Beckert KG, Albstadt (DE)

( * ) Notice: Subject to any disclaimer, the term of this patent is extended or adjusted under 35 U.S.C. 154(b) by 1118 days.

(21) Appl. No.: 10/753,874

(22) Filed: Jan. 9, 2004

(65) Prior Publication Data

US 2004/0168560 A1 Sep. 2, 2004

(30) Foreign Application Priority Data

Jan. 10, 2003 (DE) .................................. 103 00 831

(51) Int. Cl.
*B26F 1/14* (2006.01)
(52) U.S. Cl. ................. 83/146; 83/129; 83/213; 83/691
(58) Field of Classification Search .................. 83/129, 83/132, 146, 202, 212.1, 213, 215, 679, 563, 83/549, 691, 698.11, 552, 684–688, 697, 83/694, 929.1, 698.91; 234/115–119, 98, 234/105–111
See application file for complete search history.

(56) References Cited

U.S. PATENT DOCUMENTS

| | | | | | |
|---|---|---|---|---|---|
| 3,477,317 | A | * | 11/1969 | Liander | 76/107.1 |
| 4,092,888 | A | * | 6/1978 | Wilson | 83/140 |
| 4,141,264 | A | * | 2/1979 | Weisbeck | 83/23 |
| 4,246,815 | A | * | 1/1981 | Hugo | 83/139 |
| 4,425,829 | A | * | 1/1984 | Kranik et al. | 83/62.1 |
| 4,440,052 | A | * | 4/1984 | Weisbeck | 83/140 |
| 4,951,537 | A | * | 8/1990 | Bennett | 83/76.6 |
| 5,448,933 | A | * | 9/1995 | Grabbee | 83/24 |
| 5,600,992 | A | * | 2/1997 | Kanazawa et al. | 72/352 |
| 5,816,093 | A | * | 10/1998 | Takeuchi et al. | 72/327 |
| 5,848,563 | A | * | 12/1998 | Saito | 83/552 |
| 6,516,696 | B2 | * | 2/2003 | Cotter | 83/588 |
| 2004/0113979 | A1 | * | 6/2004 | Takashima et al. | 347/47 |

FOREIGN PATENT DOCUMENTS

DE 41 28 933 C2 2/1996
EP 64263 A2 * 11/1982

* cited by examiner

*Primary Examiner* — Phong Nguyen
(74) *Attorney, Agent, or Firm* — Fitch, Even, Tabin & Flannery, LLP

(57) ABSTRACT

A punching tool for green sheets or similar sheet-like workpieces having a support plate with punched holes (7), and a holding-down plate disposed above the support plate and containing stripper openings (24). Operative portions (23) of dies (8) extend through the stripper openings (24) and are guided therein. The operative portions (23) are formed in graduated form with a punching portion (26) of reduced diameter. Each punching portion (26) has a length that is less than the length of the stripper opening (24), and is located entirely in the stripper opening (24) when the die (8) is at its top dead center. A part (25) of the operative portion (23) protrudes into the stripper opening (24) to guide the die (8). The punching portion (26) is only approximately as long as required for the punching stroke of the die (8). The slight length of the punching portion (26) makes possible an especially slender punching portion, and thus the creation of especially small punched holes.

16 Claims, 4 Drawing Sheets

DEVICE FOR PUNCHING GREEN SHEETS

CROSS REFERENCE TO RELATED APPLICATIONS

This application is related to concurrently filed U.S. patent application Ser. No. 10/753,960, corresponding to German Patent Application Number DE 103 00 818.7, filed Jan. 10, 2003, the subject matter of which is incorporated herein by reference.

This application claims the priority of German Patent Application Number DE 103 00 831.4, filed Jan. 10, 2003, the subject matter of which is incorporated herein by reference.

BACKGROUND OF THE INVENTION

The invention relates to a device for punching unfired sheetlike ceramic substrates, in particular so-called green sheets.

In their manufacture, green sheets must as a rule be provided with a number of small holes, which are used later for instance for through-contacting of conductors applied to the ceramic substrates. While the thickness of the green sheets is as a rule largely fixed for technological reasons, there is a need to be able to punch finer and finer holes into the green sheets.

For punching the holes into the green sheets, as a rule a punching device is provided that has a tool with a plurality of dies for punching the desired holes. The tool includes a lower tool, with a substantially flat receptacle in which the cutting holes are embodied directly or in cutting bushes. Dies whose diameter defines the diameter of the punched holes to be made are assigned to the cutting holes. Each of the cutting holes is embodied in a relatively thin wall, for instance the end wall of a bush, and lead into a chute for slugs. Here, punching waste (slugs) adhering to the face ends of the dies are blown away to the side and removed by means of compressed air.

Above the green sheets, the die protrudes through a so-called stripper bush, which prevents the part of the green sheets that adheres to the die from lifting in the return stroke of the die. While the diameter of the punched holes and thus the diameter of the dies is meant to become less, the length of the punching portion of each die is determined by the guidance length of the stripper bush and the length of the cut opening. If the die diameters are too small, the result is a tendency of the die to kink.

With this as the point of departure, it is the object of the invention to create a punching tool for green sheets with which punched openings of especially small diameter can be produced technologically reliably.

SUMMARY OF THE INVENTION

The above object is generally achieved by a punching tool device of according to the invention having at least one die, but as a rule a great number of dies, each of which has an operative portion serving as a tool on its respective lower end, toward the green sheet. This operative portion extends through a stripper opening and is guided by it. The stripper opening is embodied or formed in a stripper element, for instance a stripper bush, and is surrounded by a preferably flat face that serves as a stripper face or holding-down face. During the return stroke of the dies, the stripper elements prevent the lifting of the green sheet, or the lifting of the green sheet from its support.

The stripper opening has a diameter that is greater than the diameter of the punched opening. The portion of the operative portion of the die that extends through the stripper opening or into it is embodied as graduated. It has a punching portion whose diameter is somewhat less than the diameter of the punched hole. The length of the punching portion is somewhat less than the thickness of the element in which the stripper opening is embodied.

Because of the graduation of the operative portion on its lower end, it is successfully possible to form especially narrow, that is, fine, punched holes. The diameter of the punching portion can be reduced, beyond the amount known until now, without making the punching portion unstable from an excessive vulnerability to kinking. While until now the length of the punching portion has exceeded the sum of the depth of the punched hole, the depth of the stripper opening, and the thickness of the green sheet, the punching portion now need merely have a length that is somewhat greater than the depth of the punched hole and the thickness of the green sheet. Even if it is assumed that a punching portion is not allowed to exceed a maximum ratio of length to thickness, for the sake of having adequate kink resistance, the novel design with the graduated operative portion thus affords the possibility, with unchanged green sheet thicknesses and unchanged tool strokes, of advancing to smaller punched hole diameters.

The stripper opening provides lateral guidance at the operative portion of the die, that is, in the immediate vicinity of the punching portion. In addition, the die is guided by a die guide device, through which the shaft portion of the die extends and which guides the die there. This guide device keeps excessive lateral forces away from the operative portion of the die. The die is thus subjected in a sense to a double guidance, namely on the drive end by means of the die guide device and on the operative portion end by the stripper opening.

The diameter of the punching portion is markedly less than the diameter of the stripper opening. As a result, the punching portion extends through the stripper opening without touching the wall. Between the punching portion and the wall opening and stripper opening, an annular gap is formed. Nevertheless, because of the linear support of the operative portion in the stripper opening, the punching portion experiences such precise guidance that it can plunge precisely into the punched opening. With this concept, the punched hole diameter of markedly less than 0.1 mm can be attained. For instance, punched hole diameters of 0.06 mm and less can be achieved. Conversely, the diameter of the stripper opening and the diameter of the operative portion can moreover be increased, so that overall, the die becomes even more sturdy.

Further details of advantageous embodiments of the invention will become apparent from the drawing, description or dependent claims. In the drawing, one exemplary embodiment of the invention is illustrated. Shown are:

DETAILED DESCRIPTION OF DRAWINGS

Figure 1:
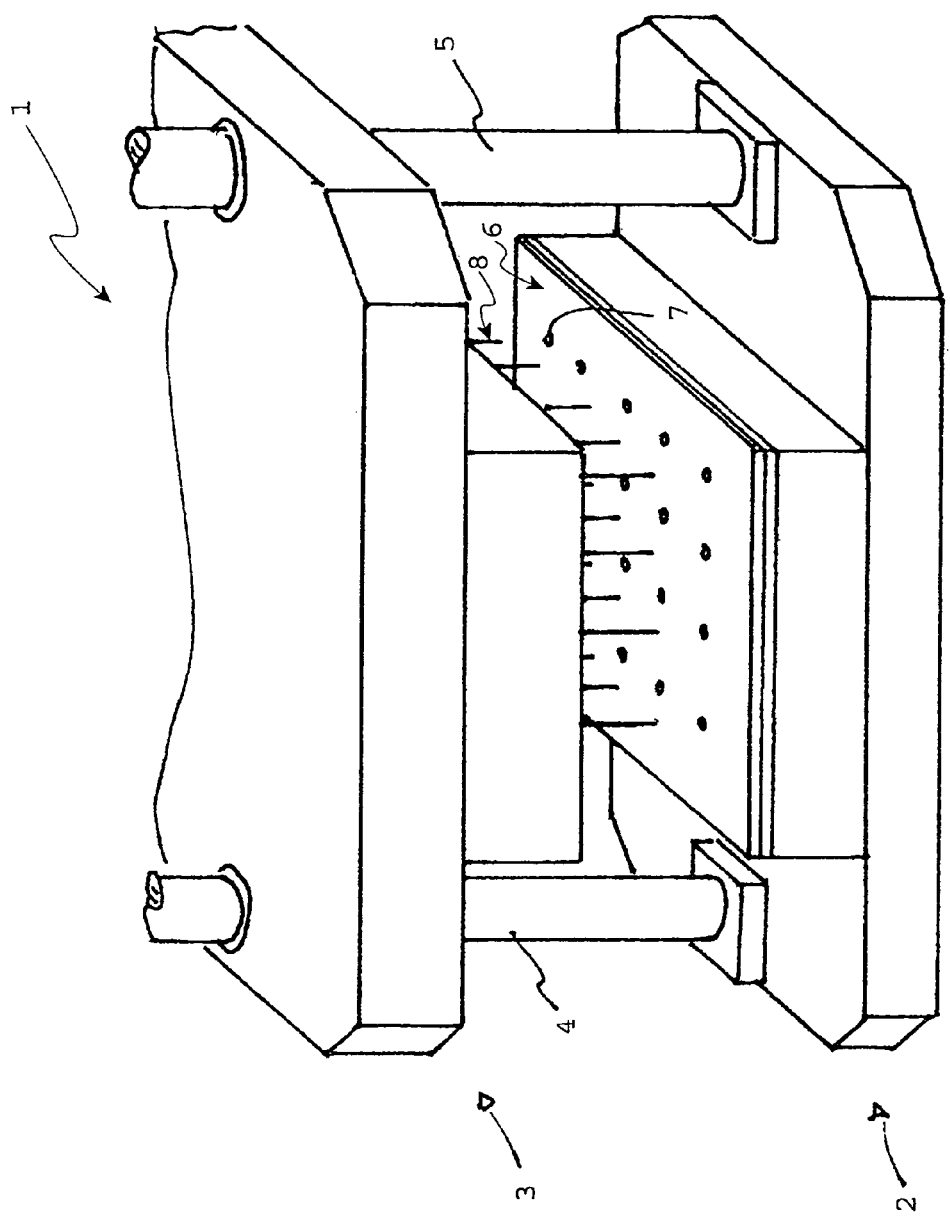
FIG. 1 illustrates a punching device according to the invention in a schematic, perspective view.

In FIG. 1, a punching tool 1 is shown, which includes a lower tool 2 and an upper tool 3. The upper tool 3 is movable linearly back and forth toward and away from the lower tool 2 by means of two guides 4, 5. The lower tool 2 includes a support plate or receiving device 6, in which punched holes 7 are embodied. The punched holes 7 are numerous in the support plate 6 and are embodied at those points at which, in a green sheet (unfired ceramic substrate) placed on the support plate 6, punched holes are to be embodied. To that end, dies 8 are disposed on the upper tool 3; they point toward the lower tool 2 and end above the support plate 6. The disposition of the dies 8 is made such that the dies 8 dip into the punched holes 7 when the dies are moved downward. For guiding the dies 8 and for holding down the green sheet located on the support plate 6, a holding-down plate 9 is disposed above the support plate 6; in FIG. 1, the holding-down plate has been omitted for the sake of greater clarity.

Figure 2:
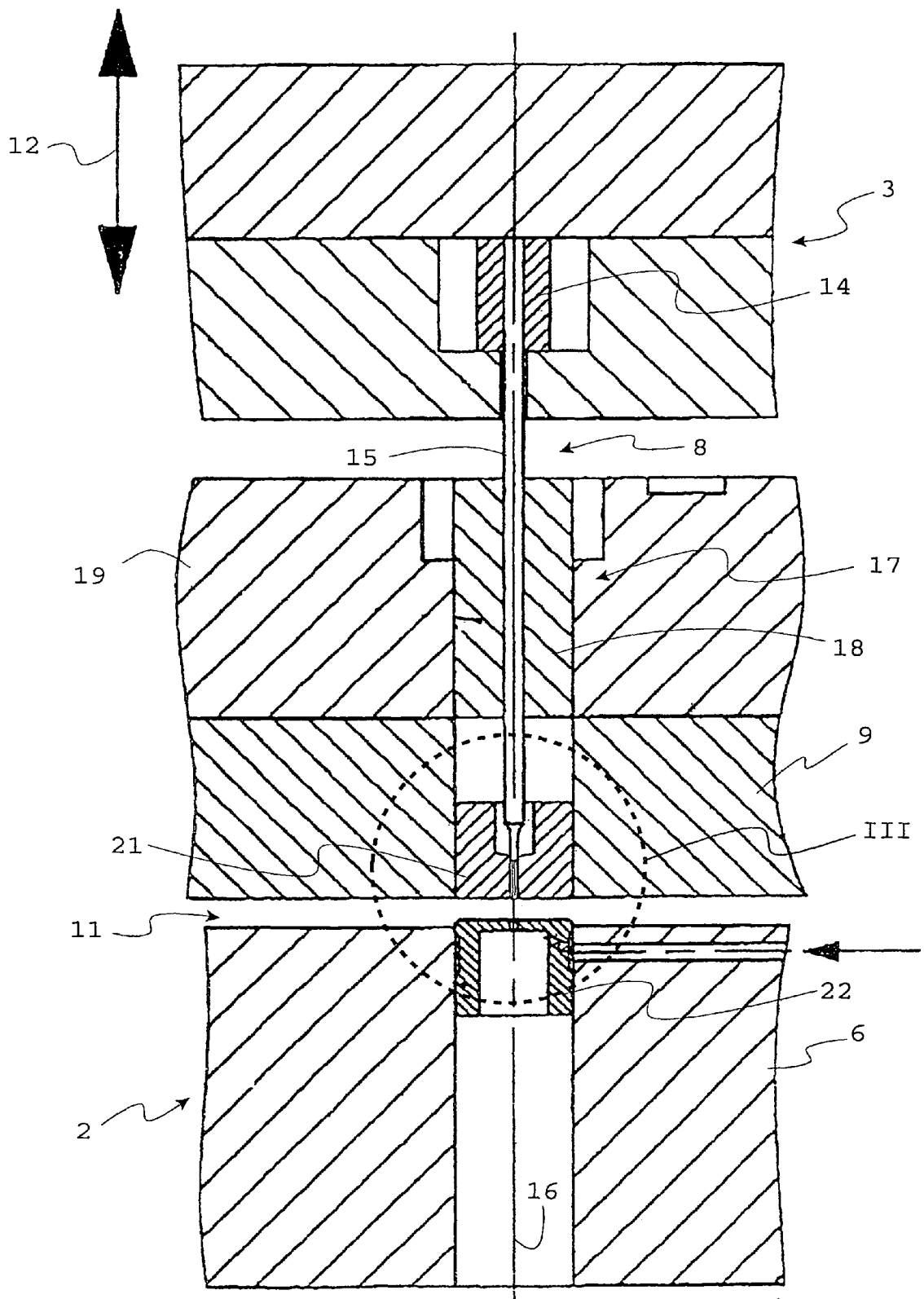
FIG. 2 shows the punching device of FIG. 1, in a schematic fragmentary sectional view.

The holding-down plate 9 can be seen from FIG. 2. It is disposed, movable vertically independently of the punching motion of the dies 8, above the support plate 6 and with it defines a gap 11. This gap is defined by one plane face each toward the holding-down plate 9 and toward the support plate 6.

The holding-down plate 9 is connected to or is a part of the upper tool 3 and is movable with it, as an arrow 12 indicates. Before the actual punching operation, the upper tool 3 is moved toward the lower tool 2 in the direction of the arrow 12. By this means, the gap 11 between the holding-down plate 9 and the lower tool 2 is created and adjusted.

For the actual punching operation, the die, which is held with its head 14 in a plate of the upper tool 3, is moved downward and upward again in the direction of the arrow 12, independently of the motion of the upper tool 3. To that end, the die 8 is provided with a separate drive mechanism (not shown).

The die 8, adjoining its head 14, has an elongated shaft 15, which is for instance embodied cylindrically and which extends coaxially to an axis 16 that is oriented parallel to the direction of motion of the upper tool 3 indicated by the arrow 12. The shaft 15 extends through a guide device 17, which contains a bush 18. The bush 18 guides the shaft 15 of the die 8 and is in turn seated in a plate 19, which is connected to the holding-down plate or is kept stationary in some other way. The bush 18 has a length which amounts to a multiple of the diameter of its guide opening, in order to lend adequate rectilinear guidance to the die 8.

For each die 8, the holding-down plate 9 has a respective passage, in which a stripper bush 21 is held. Below the stripper bush 21 in the support plate 6, there is a punching bush 22, which is likewise seated in a corresponding passage. The details of the stripper bush 21, punching bush 22, and die 8 extending through the stripper bush 21 can be seen in FIGS. 3 and 4, which illustrate the detail III marked in FIG. 2.

As can be seen, the die 8, on its lower end, has an operative portion 23, which adjoins the shaft 15 and extends through a stripper opening 24 in the stripper bush 21. The stripper opening 24 is disposed concentrically to the axis 16. Its cylindrical wall forms a guide face for the operative portion 23 of the die 8.

The operative portion 23 of the die 8 is disposed concentrically to the axis 16 and has a substantially smaller diameter than the shaft 15. For example, the diameter of the shaft 15 may be a multiple of the diameter of the operative portion 23, as can clearly be seen in FIGS. 3 and 4. The shaft 15 narrows accordingly inside the stripper bush 21, at a point that is at some distance above the upper mouth of the stripper opening 24. This distance is equal to approximately the length of the operating stroke of the die. Thus the operative portion 23 has a cylindrical portion 25, whose length is somewhat greater than the stroke of the die. The operative portion 23 extends into the stripper opening 24 and has a diameter which is only slightly less than the diameter of the stripper opening 24. This stripper opening 24 serves to guide the operative portion 23 of the die 8 relative to the punched hole 7 embodied in the punching bush 22.

The operative portion 23 of the die 8 furthermore includes a punching portion 26, whose length is shorter than the length of the stripper opening 24. The punching portion 26 has a reduced diameter compared to the portion 25. In other words, the operative portion 23 is provided with a shoulder, at which the cylindrical portion 25 merges with the likewise cylindrical punching portion 26 that is retained concentrically to the axis 18. The punching portion 26 and the wall of the stripper opening 24 thus form an annular gap; that is, the punching portion extends away from the end of the portion 25, without touching the wall of the stripper opening 24, and thus is not guided in the transverse direction. If the die 8 is in its upper extreme position (top dead center), the free end of the punching portion 26 is retracted into the stripper opening 24. The lower end of the portion 25 is likewise seated in the cylindrical stripper opening 24, so that the die 8 is guided precisely and is centered precisely relative to the punched hole 7. The diameter of the punching portion 26 is moreover less, by an operating clearance (shear gap), than the diameter of the punched hole 7.

On its upper end, the punching bush 22 has a relatively thin wall portion 27, through which the punched hole 7 extends. The gap 11 and the wall portion 27 together have a height, measured in the direction of the axis 16, that is somewhat less than the stroke of the die 8. Below the wall portion 27, the opening that penetrates the punching bush 22 widens into a slug conduit 28, into which an opening 29 opens at the side. In normal operation of the punching tool 1, this opening is subjected to compressed air.

The punching tool 1 described thus far functions as follows:

In operation, a green sheet 32 is disposed in the gap 11. This sheet is an unfired sheetlike ceramic substrate. The green sheet 32 rests on an air cushion on the support plate 6, at a slight vertical spacing below the holding-down plate 9. For making the holes, dies 8 are now moved out of the position shown in FIG. 3 into the position shown in FIG. 4. As can be seen from FIGS. 3 and 4, the length of the stripper opening 24 is somewhat greater than the stroke of the die 8, so that the shoulder 31, where the portion 25 of the operative portion 23 changes into the punching portion 26, moves downward within the stripper opening 24, but without leaving it. The punching portion 26 in the process pierces the green sheet 32 and forces a slug 33 into the punched hole 7 and through the punched hole into the slug conduit 28. In the process, the slug 33 initially adheres to the face end of the punching portion 26. Once it arrives in front of the mouth of the opening 29, it is detached from the end face of the punching portion 26 by inflowing compressed air and drops downward and is vacuumed away by an apparatus (not shown). The punching portion 26 in this process protrudes through the punched hole 7, and its end face reaches its bottom dead center below the wall portion 27.

Figure 3:
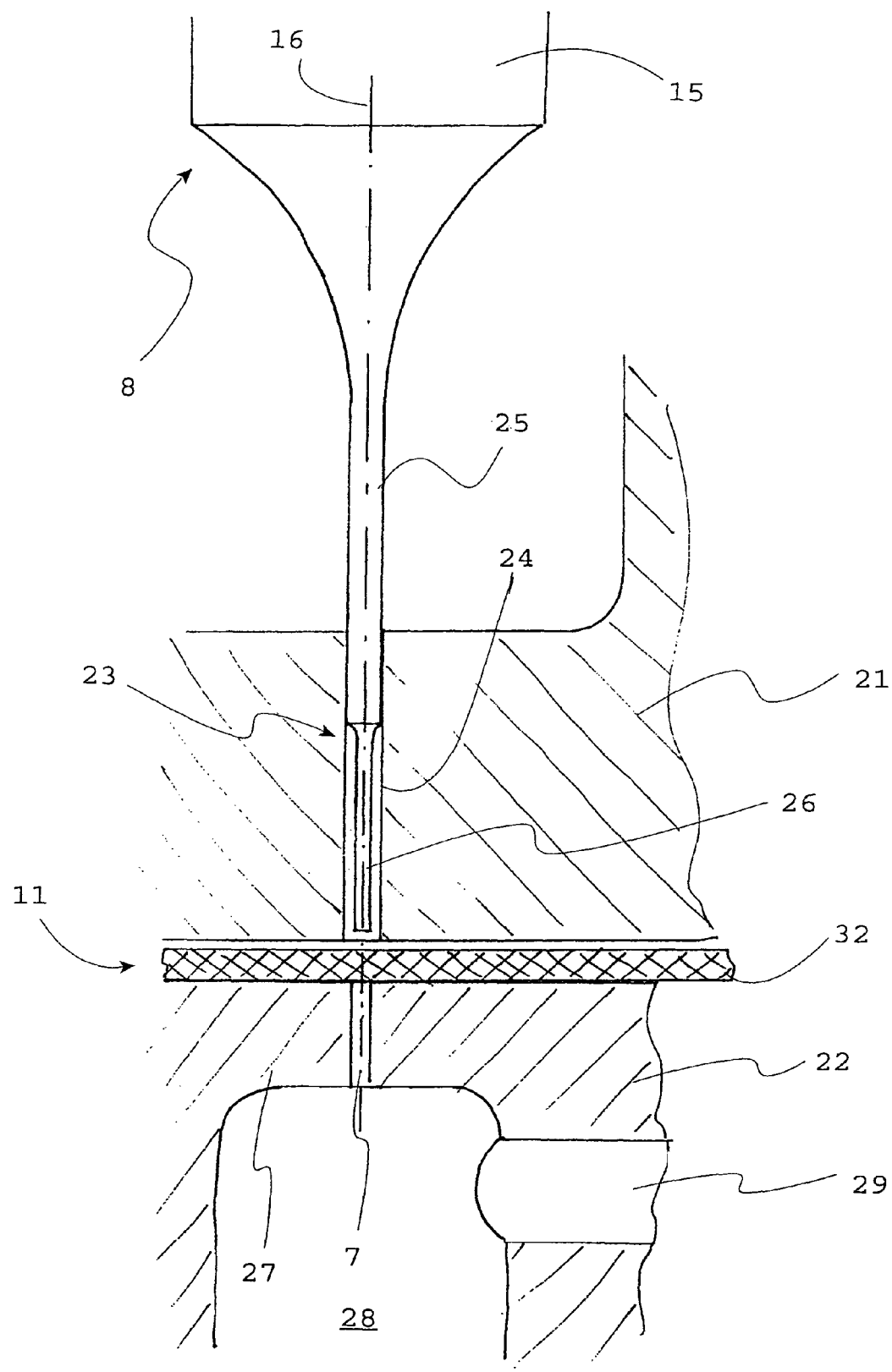
FIG. 3 shows the punching device of FIG. 2, in the position of repose, in a fragmentary view on a different scale.
Figure 4:
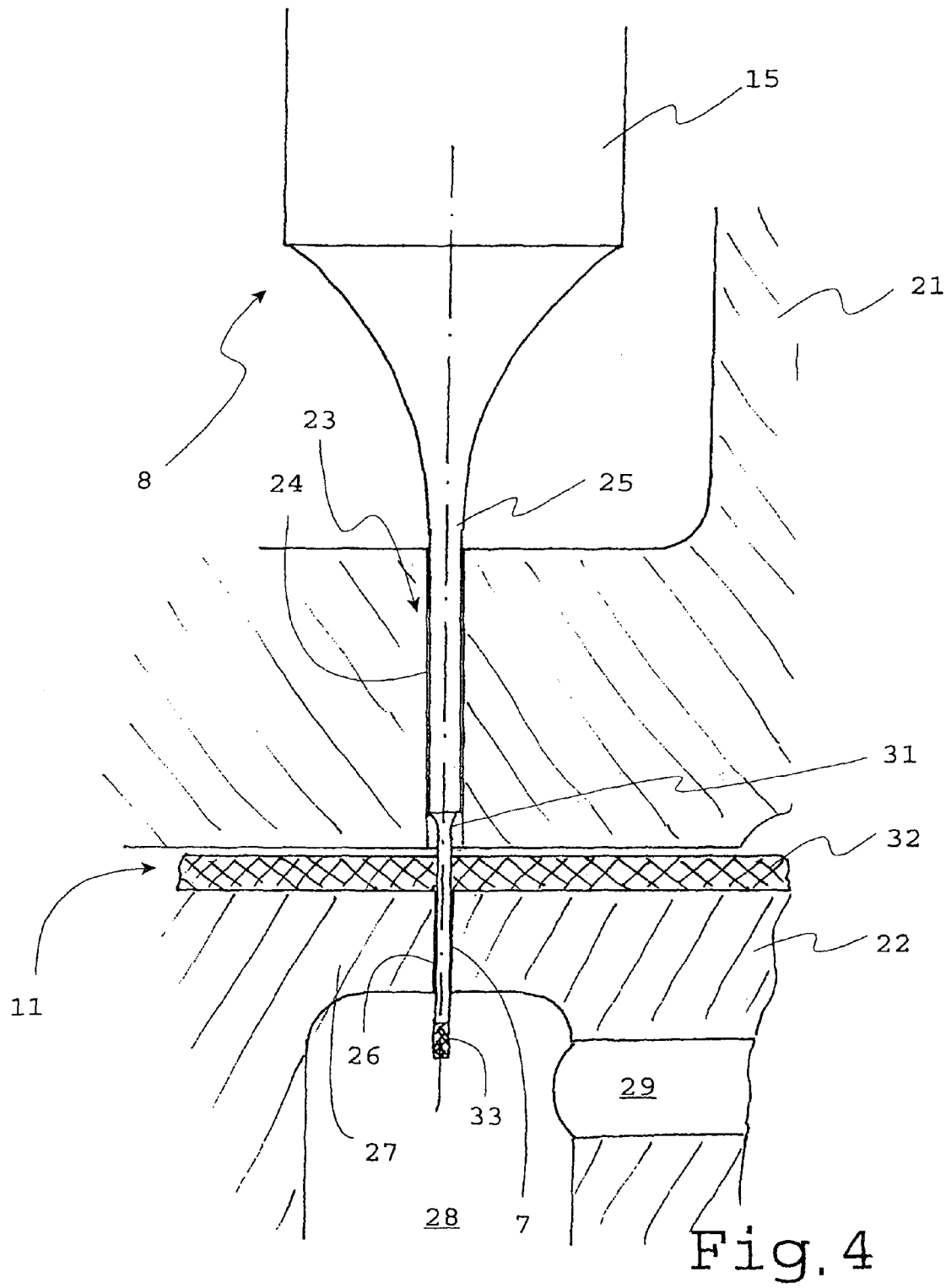
FIG. 4 shows the punching device of FIGS. 2 and 3, in a fragmentary sectional view, after the execution of a punching stroke.

The return stroke of the dies 8 occurs in the reverse direction; the punching portions 26, freed of their slugs 33, move out of the punched hole 7 and out of the green sheet 32 until the top dead center point in FIG. 3 is reached. The green sheet 32 can be transported onward so that new holes can be punched, or it can be replaced by a new, unperforated green sheet.

A punching tool for green sheets or similar sheetlike workpieces has both a support plate, with punched holes 7 embodied in it, and a holding-down plate, which is disposed above the support plate and in which holding-down openings 24 are embodied. Dies 8 extend with their operative portions 23 through the stripper openings 24 and are guided in them. The operative portions 23 are embodied in graduated form. They have a punching portion 26 of reduced diameter. The length of each punching portion 26 is less than the length of the stripper opening 24. When the die 8 is at its top dead center, the punching portion 26 is located entirely in the stripper opening 24. Moreover, a fragment of the portion 25 that belongs to the operative portion 23 protrudes into the stripper opening 24, in order to guide the die 8.

The punching portion 26 is only approximately as long as required for the punching stroke of the die 8. Its length preferably matches the length of the punching stroke. The slight length of the punching portion 26 makes an especially slender embodiment of the punching portion possible, thus making it possible to create especially small punched holes.

LIST OF REFERENCE NUMERALS

1 Punching tool
2 Lower tool
3 Upper tool
4, 5 Guides
6 Support plate
7 Punched hole
8 Die
9 Holding-down plate
11 Gap
12 Arrow
14 Head
15 Shaft
16 Axis
17 Guide device
18 Bush
19 Plate
21 Stripper bush
22 Punching bush
23 Operative portion
24 Stripper opening
25 Portion
26 Punching portion
27 Wall portion
28 Slug conduit
29 Opening
31 Shoulder
32 Green sheet
33 Slug

The invention claimed is:

1. A device for punching unfired, sheetlike ceramic substrates, in particular so-called green sheets, comprising:
a receiving device, which has a substantially flat receiving face for a ceramic substrate, and in which punched holes are embodied;
at least one die, which is disposed above an associated respective punched hole and has a shaft and an operative portion that extends through a constant diameter stripper opening, which is disposed in a stripper above the associated respective punched hole and extends to an outer face of the stripper facing the receiving face, with the operative portion having a first part with a diameter that is less than the diameter of the shaft by a multiple of the diameter of the first part, and greater than the diameter of the associated punched hole, and the first part of the operative portion, at its lower end, has a cylindrical punching portion whose diameter is somewhat less than the diameter of the punched hole and whose length is less than the length of the stripper opening;
a drive mechanism, which is connected in driving fashion to the die in order to move linearly by a defined stroke and in the process to move the punching portion into the punched hole and out of it; and
a die guide device, through which the shaft extends and which guides the die at its shaft.

2. The punching device of claim 1, wherein the punching portion is unguided in a transverse direction.

3. The punching device of claim 1, wherein the die guide device includes a bush with a passage which defines a guide face for the outer surface of the shaft.

4. The punching device of claim 1, wherein the length of the punching portion is essentially equal to the length of the stroke of the drive mechanism.

5. The punching device of claim 1, wherein the length of the operative portion is greater than the stroke of the drive mechanism.

6. The punching device of claim 1, wherein the punched hole is a through bore, which opens into a slug conduit which has a greater diameter than the punched hole.

7. A device for punching sheet-like substrates, comprising:
a receiving device having a substantially flat receiving face for a ceramic substrate, and having a punched hole formed in the flat surface;
a die disposed above the punched hole, said die having a shaft, and an operative portion that extends through and is guided in a constant diameter stripper opening disposed in a stripper above the punched hole and extending to an outer surface of the stripper facing the receiving face, said operative portion including a first part that is guided by a surface defining the stripper opening and has a diameter that is less than the diameter of the shaft and greater than the diameter of the punched hole, and a second cylindrical punching part that is disposed at a lower end of the first part, and has a diameter that is less than the diameter of the first part and slightly less than the diameter of the punched hole and a length that is less than the length of the stripper opening so that a portion of the first part is always guided within the stripper opening, and with the diameter of the shaft being a multiple of the diameter of the first part of the operative portion;
a drive mechanism connected in driving fashion to the die to move the die linearly by a defined stroke and in the process move the punching part into and out of the punched hole; and
a die guide through which the shaft extends and which guides the die shaft.

8. The punching device of claim 7, wherein the shaft, and first part of the operative portion of the die are each cylindrical.

9. The punching device of claim 7, wherein the punching part is unguided in the transverse direction in the stripper opening.

10. The punching device of claim 7, wherein the die guide device includes a bush through which the shaft extends, with the bush having a passage that defines a guide surface for the outer surface of the shaft.

11. The punching device of claim 7, wherein the length of the punching part is essentially equal to the length of the stroke of the drive mechanism.

12. The punching device of claim 7, wherein the length of the operative portion is greater than the stroke of the drive mechanism.

13. The punching device of claim 7, wherein the diameter of the first part is less than the diameter of the stripper opening by a clearance amount.

14. A tool for punching sheet-like substrates, comprising:
   a lower tool part having a substantially flat receiving face for a substrate, and having a punched hole formed in the flat surface;
   an upper tool part
   a die having a shaft, and a graduated operative portion including a first part having a diameter that is less than the diameter of the shaft and greater than the diameter of the punched hole, and a second cylindrical punching part disposed at a lower end of the first part and having a diameter that is less than the diameter of the first part and slightly less than the diameter of the punched hole, and with the diameter of the shaft being a multiple of the diameter of the first part of the operative portion;
   a linear die guide disposed in the upper tool part above the punched hole;
   a stripper bush mounted on a surface of the upper tool part facing the lower tool part and having a constant diameter stripper opening disposed above the punched hole and extending to an outer surface of the stripper bush facing the receiving surface;
   said die being disposed above the punched hole and mounted in the upper tool part for linear movement toward and away from the lower tool part, with the shaft of the die being disposed in and guided by the linear die guide, the second punching part of the operative portion having a length that is less than the length of the stripper bush, and the first part of the operative portion of the die always extending into the stripper opening and being guided by a wall of the stripper bush defining the stripper opening; and
   a drive mechanism connected in driving fashion to the die to move the die linearly by a defined stroke and in the process move the punching part into and out of the punched hole.

15. The punching device of claim 14, wherein the shaft, and first part of the operative portion of the die are each cylindrical.

16. The punching device of claim 15, wherein the diameter of the first part is less than the diameter of the stripper opening by a clearance amount.

* * * * *